United States Patent [19]

Chang

[11] Patent Number: 5,429,969
[45] Date of Patent: Jul. 4, 1995

[54] PROCESS FOR FORMING ELECTRICALLY PROGRAMMABLE READ-ONLY MEMORY CELL WITH A MERGED SELECT/CONTROL GATE

[75] Inventor: Kuo-Tung Chang, Austin, Tex.

[73] Assignee: Motorola, Inc., Schaumburg, Ill.

[21] Appl. No.: 251,162

[22] Filed: May 31, 1994

[51] Int. Cl.[6] .......................................... H01L 21/8247
[52] U.S. Cl. ........................................ 437/43; 437/44; 437/191
[58] Field of Search ................... 437/43, 44, 191, 984; 148/DIG. 20

[56] References Cited

U.S. PATENT DOCUMENTS

| | | | |
|---|---|---|---|
| 4,302,766 | 11/1981 | Guterman et al. | 437/191 |
| 4,949,140 | 8/1990 | Tam | 257/316 |
| 5,063,172 | 11/1991 | Manley | 437/43 |
| 5,147,813 | 9/1992 | Woo | 437/43 |
| 5,194,925 | 3/1993 | Ajika et al. | 257/314 |
| 5,231,041 | 7/1993 | Arima et al. | 437/43 |
| 5,256,584 | 10/1993 | Hartmann | 437/43 |
| 5,268,319 | 12/1993 | Harari | 437/43 |
| 5,268,585 | 12/1993 | Yamauchi | 257/316 |
| 5,296,396 | 3/1994 | Bellezza | 437/43 |

OTHER PUBLICATIONS

Heinrich, et al.; "A 0.5 μm CMOS Technology for Multifunctional Appl. with Embedded, etc.;" IEDM; pp. 445–448 (1993).

*Primary Examiner*—Chandra Chaudhari
*Attorney, Agent, or Firm*—George R. Meyer

[57] ABSTRACT

Flash EEPROM cells having merged select/control gates may be formed, so that the portions of the channel regions that correspond to select transistors are formed after spacers are formed but prior to patterning a merged select/control gate layer. Because the portions of the channel regions that correspond to the select transistors are not determined by the patterning of the merged select/control gate layer, misalignment of the mask used to pattern the merged select/control gate layer does not affect the size of the select transistor portion of the channel region. The spacers may be left on over the substrate in the finished devices thereby saving at least one processing step. The memory structure may also be used in other EPROM-type memory cells, such as individually erasable EEPROMs and EPROMs that are not electrically erasable.

20 Claims, 3 Drawing Sheets

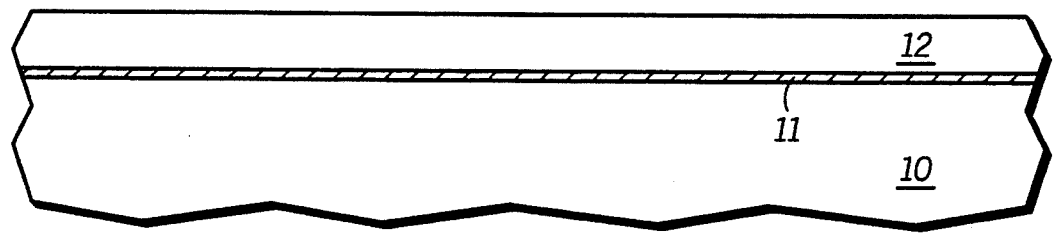
FIG.1
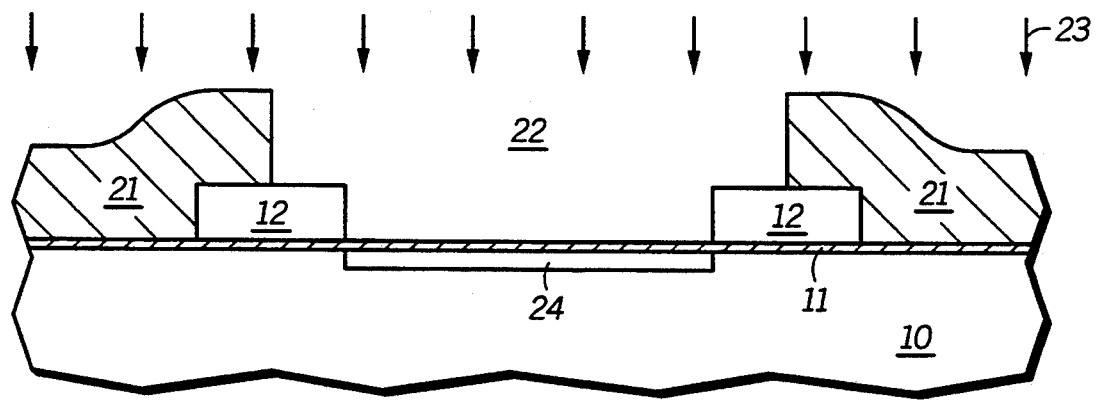
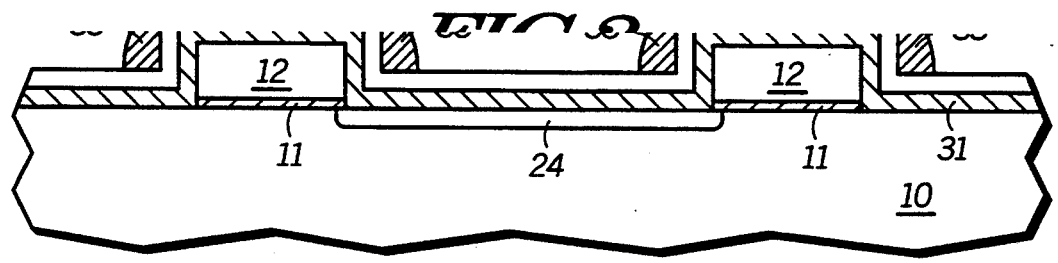
FIG.3
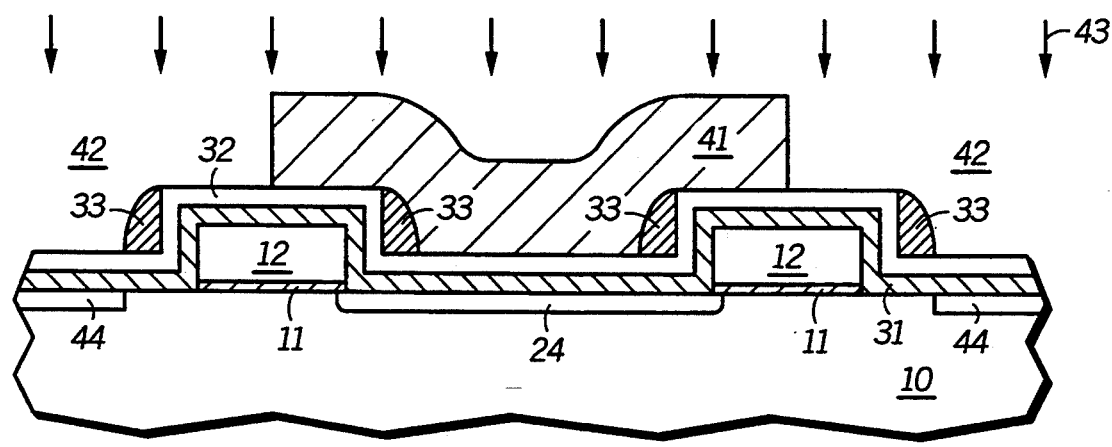
FIG.4

PROCESS FOR FORMING ELECTRICALLY PROGRAMMABLE READ-ONLY MEMORY CELL WITH A MERGED SELECT/CONTROL GATE

FIELD OF THE INVENTION

The present invention relates to the field of semiconductor devices, and in particular, to semiconductor devices having an array of electrically programmable read-only memory cells.

BACKGROUND OF THE INVENTION

Floating gate memory devices include electrically erasable and electrically programmable read-only memories (EEPROMs) or flash electrically erasable and electrically programmable read-only memories (flash EEPROMs). Many types of memory cells for EEPROMs or flash EEPPROMs may have source and drain regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Many types of EEPROMs and flash EEPROMs use merged select/control gate electrodes to reduce the size of the memory cell. By merged, it is meant that one or more conductive members or layers form both the select gate and control gate of the memory cell. If more than one conductive member or layer is used for the merged select/control gate, the members or layers are electrically connected together, so that they are at about the same potential. The select gate portion of a conductive member of a merged select/control gate is typically formed by a masking operation. A non-functional or poorly functioning memory cell is formed if the channel region between the source region and floating gate or between the drain region and the floating gate is not covered by the conductive member. As dimensions of memory cells become smaller, misalignment of masking layers becomes more important. A memory cell is typically sized larger if misalignment tolerances must be taken into account.

SUMMARY OF THE INVENTION

The present invention includes an electrically programmable read-only memory cell comprising a semiconductor substrate, a first doped region, a second doped region, a channel region, a gate dielectric layer, a floating gate, an intergate dielectric layer, a first conductive member, and spacers. The semiconductor substrate and channel region have a first conductivity type, and the first and second doped regions have a second conductivity type that is opposite the first conductivity type. The first doped region lies within the substrate. The second doped region lies within the substrate and is spaced apart from the first doped region. The channel region lies within the substrate and between the first and second doped regions. The gate dielectric layer overlies the substrate. The floating gate overlies the substrate, only a portion of the channel region, and a portion of the first doped region but does not overlies the second doped region. The intergate dielectric layer overlies the substrate and lies adjacent to the floating gate. The first conductive member lies adjacent to the intergate dielectric layer and overlies portions of the first and second doped regions and the channel region including at least part of that portion of the channel region that is not covered by the floating gate. The spacers overlie and are adjacent to portions of the first conductive member and adjacent to sides of the floating gate. The present invention also includes a memory array with a plurality of the memory cells and a process for forming the memory cell and memory array.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 1 includes a cross-sectional view of a portion of a substrate including a tunnel dielectric layer and a floating gate layer.

FIG. 2 includes a cross-sectional view of the substrate of FIG. 1 during a drain region doping step.

FIG. 3 includes a cross-sectional view of the substrate of FIG. 2 after forming a first conductive layer and spacers.

FIG. 4 includes a cross-sectional view of the substrate of FIG. 3 during a source doping step.

DETAILED DESCRIPTION OF EMBODIMENTS

Figure 5:
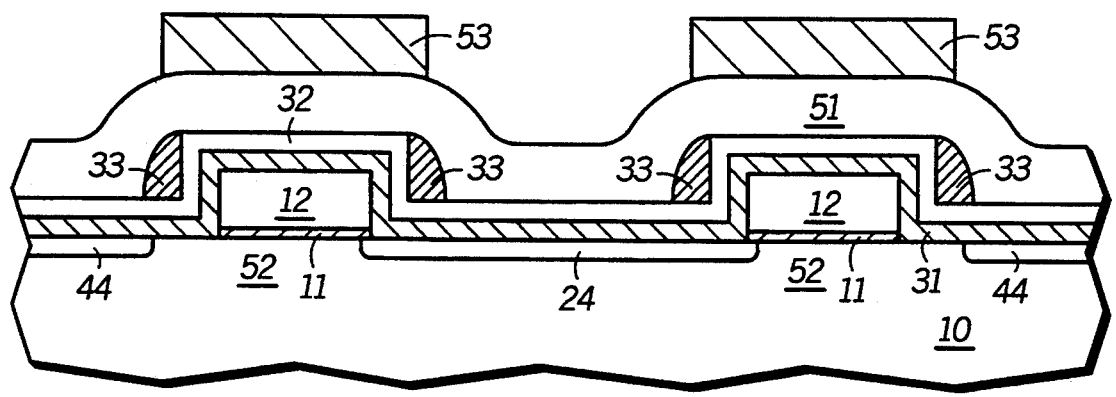
FIG. 5 includes a cross-sectional view of the substrate of FIG. 4 after a gate mask has been formed over a second conductive layer.

EPROM-type memory cells may be formed where a drain region is aligned to a floating gate and a source region is formed after forming part of a merged select/control gate and spacers adjacent to the floating gate. The present invention is better understood with the description of the embodiments below.

Flash EEPROM Memory Array

FIG. 1 includes an illustration of a cross-sectional view of a portion of a p-type semiconductor substrate 10. A tunnel dielectric layer 11 overlies the substrate 10, and a silicon layer 12 overlies the tunnel dielectric layer 11. The tunnel dielectric 11 may include materials, such as silicon dioxide, silicon nitride, nitrided oxides or any combination thereof. The silicon layer 12 typically includes amorphous silicon or polysilicon and is typically doped with an n-type dopant to make the layer 12 relatively conductive (compared to substrate 10).

The silicon layer 12 is patterned to form floating gates 12 as shown in FIG. 2. A masking layer 21 is formed over portions of the floating gates 12 and tunnel dielectric layer 11. Openings 22 are formed where drain regions for the memory cells will be located. The substrate is ion implanted with arsenic to a dose of at least 1E15 ions per square centimeter. The ion implanting is illustrated by arrows 23 that form doped regions 24 within the substrate 10 as shown in FIG. 2. The doped regions 24 are self-aligned to the edges of the floating gates 12. Note that FIG. 2 illustrate one doped region 24, but the memory array has a plurality of doped regions 24 that are not seen in FIG. 2.

The masking layer 21 and portions of the tunnel dielectric layer 11 that do not underlie the floating gates 12 are then removed as shown in FIG. 3. An intergate dielectric layer 31 is then formed over exposed portions of the substrate 10 and along the sides and tops of the floating gates 12. The intergate dielectric layer 31 may include thermally grown oxide or may also include an oxide-nitride-oxide stack. A merged select/control gate (MSG) layer 32 is deposited over the intergate dielectric layer 31. The MSG layer 32 typically includes an in-situ phosphorous doped polysilicon layer. In alternate embodiments, the MSG layer 32 may also include amorphous silicon or other n-type dopants, such as arsenic, antimony, and the like. For this particular embodiment, the MSG layer 32 has a thickness of about 500 angstroms, and the intergate dielectric layer 31 has a thickness of about 200 angstroms. In alternate embodiments, the MSG layer 32 may have a thickness ranging from 400–600 angstroms, and the intergate dielectric layer may have thickness ranging from 100–500 angstroms.

Sidewall spacers 33 are formed along portions of the MSG layer 32 that lie adjacent to the floating gates 12 as shown in FIG. 3. The sidewall spacers 33 include a material that has an etch rate different from a subsequently formed conductive layer, which typically includes a silicon-containing and/or metal-containing material. Therefore, spacers 33 may include silicon dioxide, silicon nitride, or any other material, as long as that material does not significantly etch when the subsequently formed conductive layer and MSG layer 32 are patterned. The spacers 33 are formed by depositing a layer to a thickness in a range of 2000–3000 angstroms and anisotropically etching the layer to form the spacers. The thickness of the layer used to form the spacers 33 will generally determine how far the base of the spacers extend from the vertical portions of the MSG layer 32. As can be seen in FIG. 3, the doped regions 24 have diffused slightly, so that it underlies some of the spacers 33 and portions of the floating gates 12.

Another masking layer 41 is formed over portions of the floating gates 12 and also over the doped regions 24. Openings 42 are located where source regions for the memory cells will be located. The substrate 10 is ion implanted with phosphorus ions as shown as arrows 43 in FIG. 4. The ion implant is performed at an energy that allows the ions to pass through the MSG layer 32 and intergate dielectric layer 31 to form doped regions 44. For the specific embodiment chosen, the MSG layer 32 is 500 angstroms thick, and the intergate dielectric layer is 200 angstroms thick. As such, phosphorous ions may be implanted at an energy of about 120 kiloelectron volts to a dose of about 1E14 phosphorous ions per square centimeter. At this energy, the ions have enough energy so that the projected range (Rp) minus three times the standard deviation of the projected range ($\Delta$Rp) is greater that the sum of the thicknesses of the layers 31 and 32. The implanting dose for the regions 44 may either be moderately or heavily doped, and therefore, the dose is typically at least 1E13 ions per square centimeter and may even exceed 1E15 ions per square centimeter.

In alternate embodiments, the MSG layer 32 may be 400 angstroms thick and the intergate dielectric layer 31 may be 100 angstroms thick. In this specific embodiment, the ion implant may be performed at an energy of about 75 kiloelectron volts because the Rp$-3\Delta$Rp is greater than 500 angstroms. Therefore, 75 kiloelectron volts with phosphorus is sufficient to get through this layer. In general, the energy of the ion implanting step should be selected, so that most of the ions are implanted into the substrate 10. In alternate embodiments, arsenic may be chosen to form the doped regions 44 but may require substantially more energy to perform the ion implant. As such, an arsenic ion implant may damage the portions of the intergate dielectric layer 33 that overlie the floating gates 12 and may possibly cause reliability problems.

The masking layer 41 is removed, and a conductive layer 51 is formed over the substrate 10 including the MSG layer 32 and the sidewall spacers 33. The conductive layer 51 typically has a thickness in a range of 1500–3000 angstroms and may include a silicon-containing or metal-containing material and may be doped with n-type dopants or p-type dopants. For example, the conductive layer 51 may be phosphorus-doped polysilicon. If the conductive layer includes a dopant, the dopant may be incorporated into the conductive layer 51 by in situ doping, ion implant, or furnace doping. Masking members 53 are formed over the conductive layer to define where the control gates for the memory cells will lie as shown in FIG. 5.

Portions of both the MSG layer 32 and conductive layer 51 that are not covered by the masking members 53 or spacers 33 are etched. The masking members 53 protect the portions of the conductive layer 51 that overlie the floating gates 12, and the sidewall spacers 33 protect portions of the MSG layer 31. The patterning forms MSG members 31 and conductive members 51. After the patterning step, the masking members 53 are removed.

Figure 6:
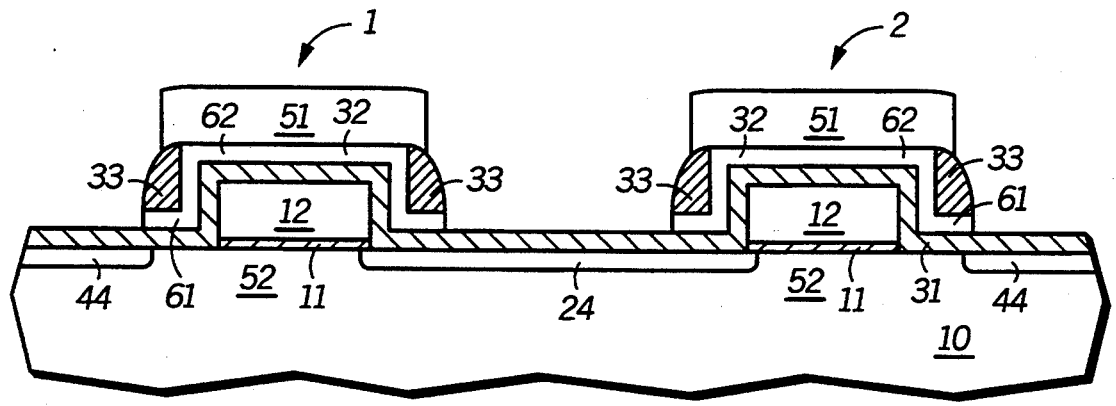
FIG. 6 includes a cross-sectional view of the substrate of FIG. 5 after patterning the second conductive layer.

FIG. 6 includes a cross-sectional view after the masking members 53 are removed. As seen in FIG. 6, the doped regions 44 partially diffuse underneath portions of some of the sidewall spacers 33 of memory cells 1 and 2. In this embodiment, the MSG members 32 are aligned to the spacers 33. Therefore, the MSG members 32 do not extend beyond the edges of the spacers 33. Referring to FIG. 6, portions 62 of the MSG members 32 lie adjacent to the top and sides of the floating gates 12. These portions of the MSG members 32 are the control gates. Portions 61 of the MSG member 51 that overlie portions of doped regions 44 and the channel region 52 are the select gates. The lengths of the channel regions 52 beneath the select gate portions 61 of the MSG member 32 are a function of the width of the spacers 33 at the bases of the spacers 33 and distance that the doped regions 44 laterally diffuse. Therefore, the lengths of the channel regions 52 beneath the select gate portions 61 are not determined by a masking step used to form the select gate portions. Compare this to a conventional EEPROM device that has merged select/control gates where the lengths of the channel regions beneath the select gate portions are determined in part by the alignment of the floating gate masking layer to the select/control gate masking layer.

Figure 7:
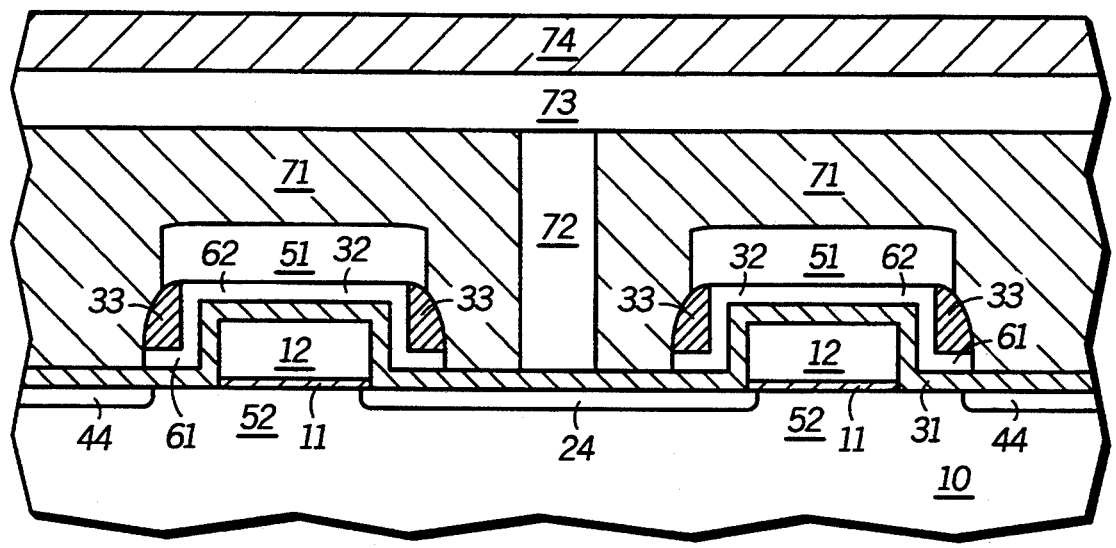
FIG. 7 includes a cross-sectional view of the substrate of FIG. 6 after forming a substantially completed device.
Figure 8:
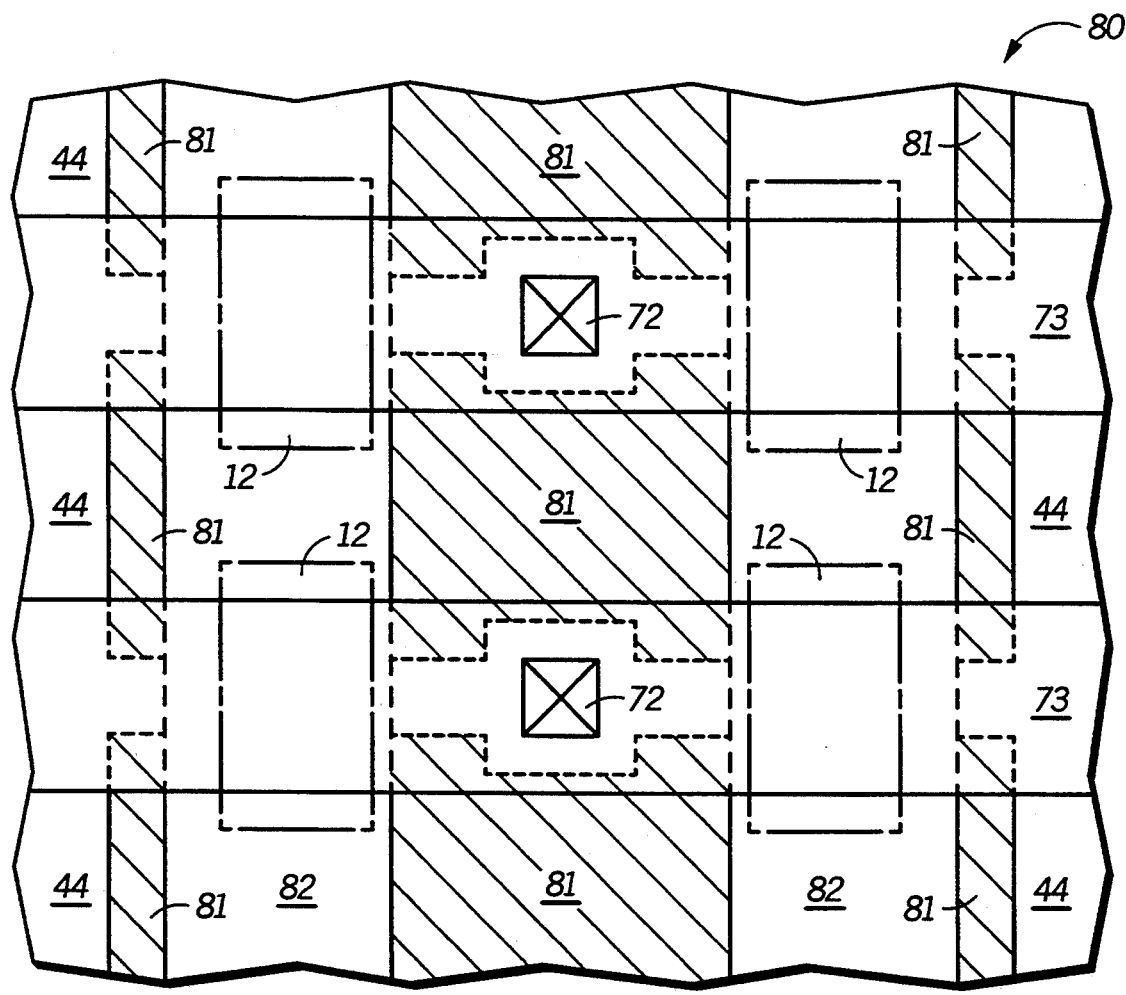
FIG. 8 includes a plan view of a portion of a memory array including memory cells.

The device is further processed to form a substantially completed device as shown in FIG. 7. The device includes an interlevel insulating layer 71, a contact plug 72, an interconnect 73, and a passivation layer 74. FIG. 8 includes a plan view of the device. As can be seen, the memory array 80 has field isolation regions 81. Other than the field isolation regions 81, dielectric layers, insulating layers, and spacers are not shown in FIG. 8 for simplicity. The interconnects 73 laterally cross FIG. 8 from side-to-side and make contact to the doped regions 24 (not shown in FIG. 8) via the contact plugs 72 that underlie the interconnects 73. The combinations of the members 32 and 51 are illustrated as members 82 in FIG. 8. The members 82 are oriented perpendicular to the interconnects 73 and generally extend from the top to the bottom of FIG. 8. Underlying portions of the members 82 are floating gates 12. Also seen within the figure, are doped regions 44 which form common sources for several different transistors within the array 80. The shorter dashed lines that are illustrated within interconnects 73 correspond to the edge between the field isolation regions 81 and the doped regions 24 or 44 that underlie the interconnects 73. Note that although field isolation regions 81 that lie beneath interconnects 73 are not visible, hatching lines for field isolation regions 81 are extended beneath the interconnects 73 to more clearly illustrate the edge between the field isolation and active regions. The longer dashed lines correspond to the edges of portions of the conductive members 82 that underlie the interconnects 73. The line-dash-lines correspond to the edges of the floating gates 12 that underlie the members 82.

Programming and Erasing

In one embodiment, the devices may be programmed and erased by tunneling. Below are one set of parameters (in volts) for programming, erasing, and reading:

TABLE 1

| Programming, erasing, and reading parameters. | | | |
|---|---|---|---|
| | Substrate | Source (Region 44) | Drain (Region 24) | Select/Control Gate (Members 31 and 51) |
| Program | 0 | 0 | 5 | −10 |
| Erase | 0 | 0 | 0 | 13 |
| Read | 0 | 0 | 1 | $V_{DD}$ |

The voltages actually used may be within two volts (plus or minus) of those given in Table 1. In addition, $V_{DD}$ may be in a range of 3–5 volts. Still, $V_{DD}$ may be as low as 0.9 volt. In addition to the programming, erasing, and reading methods described above, the devices may be programmed using hot electron injection. If hot electron injection is used, the source and substrate may be grounded, the drain may be at a potential of in a range about 5–7 volts and the select/control gate may be at a potential in a range of about 6–8 volts. Erasing may be performed by placing the drain at a potential of about −5 volts to −8 volts and placing the select/control gate at a potential in a range of about 5–8 volts. Other programming, erasing, and reading methods are possible. The examples presented are meant to illustrate and not limit the present invention.

Benefits and Options

Figure 9:
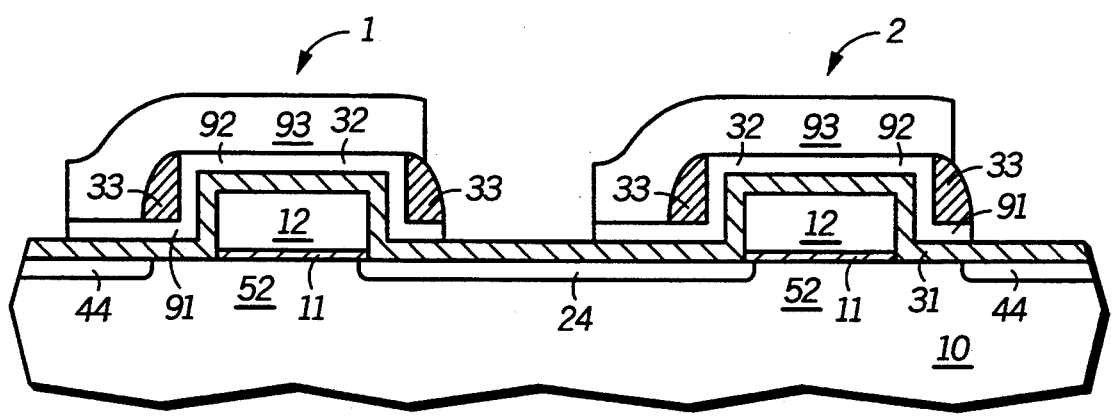
FIG. 9 includes a cross-sectional view of the substrate similar to the one illustrated in FIG. 6 if misalignment occurs.

The present invention includes many benefits. The regions 44 are formed to be self-aligned to the spacers 33 and are formed prior to patterning the MSG layer 32 and prior to forming the conductive layer 51. Conventional processes may form regions similar to regions 44 after a conductive layer similar to conductive layer 51 has been patterned. The embodiments of the present invention allow some misalignment of the masking members 53. Referring to FIG. 9, the conductive members 93 are patterned such that they are offset towards the left of the FIG. 9, but this offset towards the left does not affect the length of the channel region 52 underlying the select gate portions 91. Also, the offset does not affect the capacitive coupling between the control gate portions 92 of the MSG members 32 and the underlying floating gates 12. In other words, the process to form the device is more misalignment tolerant than many merged select/control gate EEPROMs.

Another benefit of the present invention is that the lengths of the channel regions 52 underlying the select gate portions 61 or 91 may be adjusted by changing the thickness of the layer used to form the spacers 33. If the lengths of the channel regions beneath the select gate portions 61 or 91 are to be wide, a thick layer should be used to form the spacers 33. If they are to be narrow, a thin layer should be used to form the spacers 33.

Another benefit of the present invention is that the process to form the devices is relatively easy and does not require any development of marginal or difficult processing steps. Spacers 33 are not removed, but are part of the finished device. Because spacers 33 are not removed, less processing steps are required. In addition, the MSG layer 32 is less likely to be contaminated or damaged during the extra processing step.

The process may be easily integrated into a conventional process flow such that not only may the memory array 80 be formed but also CMOS peripheral circuits may be formed simultaneously with the memory array. More specifically, the intergate dielectric layer 31 may also be the gate dielectrics for the peripheral transistors. For example, if the peripheral transistors require a 150 angstroms of silicon dioxide, the intergate dielectric layer 31 may be formed by thermally oxidizing the substrate 10 and exposed portions of the floating gates 12, such that 150 angstroms of oxide is grown from the exposed surfaces of the substrate 10.

A further benefit of the present invention is that it may be used to form EPROMs or individually erasable EEPROMs, in addition to flash EEPROMs. If the device formed is not programmed or erased by tunneling, the tunnel dielectric layer 11, which is a type of a gate dielectric layer, may be replaced by a thicker gate dielectric layer that is typically up to 500 angstroms thick. The tunnel dielectric layer 11 is typically in a range of 50–150 angstroms thick. Because the present invention may be used for any one of the three different devices, implementation of the invention is flexible. In addition, the select gate portion of the device helps to prevent over-erasing that may typically occur with flash EEPROM devices.

In the foregoing specification, the invention has been described with reference to specific embodiments thereof. However, it will be evident that various modifications and changes may be made thereto without departing from the broader spirit or scope of the invention as set forth in the appended claims. Accordingly, the specification and drawings are to be regarded in an illustrative rather than a restrictive sense.

What is claimed is:

1. A process for forming an electrically programmable read-only memory cell comprising the steps of:

forming a floating gate adjacent to a semiconductor substrate having a first conductivity type;

forming a first doped region having a second conductivity type that is opposite the first conductivity type, wherein the first doped region lies within the substrate and underlies a portion of the floating gate;

forming a first conductive member lying adjacent to the floating gate and overlying a portion of the substrate that is not covered by the floating gate;

forming a spacer overlying and adjacent to the first conductive member and sides of the floating gate, wherein this step is performed after the step of forming the first doped region; and forming a second doped region having the second conductivity type, wherein:
this step is performed after the step of forming the spacer; and
the second doped region lies within the substrate and underlies portions of the first conductive member and spacer but does not underlie the floating gate.

2. The process of claim 1, wherein:
the step of forming the first doped region is performed such that the first doped region is a drain region of the memory cell and is self-aligned to the floating gate; and
the step of forming the second doped region is performed such that the second doped region is a source region of the memory cell and is self-aligned to the spacer.

3. The process of claim 1, wherein the step of forming the first conductive member is performed such that the portion of the first conductive member that overlies a channel region and does not overlie the floating gate is a select gate for the memory cell.

4. The process of claim 1, further comprising a step of forming a second conductive member, wherein:
the second conductive member overlies the first conductive member and the spacer;
the first and second conductive members are electrically connected to each other; and
a combination of the first and second conductive members is a control gate for the memory cell.

5. The process of claim 4, wherein the first and second conductive members include silicon.

6. A process for forming a memory array including a plurality of electrically programmable read-only memory cells comprising the steps of:
forming floating gates adjacent to a semiconductor substrate having a first conductivity type;
forming first doped regions having a second conductivity type that is opposite the first conductivity type, wherein the first doped regions lie within the substrate and underlie portions of the floating gates; and
forming first conductive members lying adjacent to the floating gates and overlying portions of the substrate that are not covered by the floating gates;
forming spacers overlying and adjacent to the first conductive members and sides of the floating gates, wherein this step is performed after the step of forming the first doped regions;
forming second conductive members overlying the first conductive members and the spacers, wherein:
one of the first conductive members and one of second conductive members are electrically connected to each other; and
combinations of the first and second conductive members are control gates for the memory cells; and forming second doped regions having the second conductivity type, wherein:
this step is performed after the step of forming the spacers; and
the second doped regions lie within the substrate and underlie portions of the first conductive members and spacers but do not underlie the floating gates.

7. The process of claim 6, wherein:
the step of forming the first doped regions is performed such that the first doped regions are drain regions of the memory cells and are self-aligned to the floating gates; and
the step of forming the second doped regions is performed such that the second doped regions are source regions of the memory cells and are self-aligned to at least some of the spacers.

8. The process of claim 6, wherein the step of forming the first conductive members is performed such that the portions of the first conductive members that overlie channel regions and do not overlie the floating gates are select gates for the memory cells.

9. The process of claim 6, wherein the first and second conductive members include silicon.

10. The process of claim 6, wherein the step of forming the spacers is performed such that the spacers include a material selected from a group consisting of silicon dioxide and silicon nitride.

11. The process of claim 6, wherein the step of forming the spacers is performed such that the spacers include a material that etches at a different etch rate compared to the first and second conductive members.

12. The process of claim 2, wherein the step of forming the spacer is performed such that the spacer includes a material selected from a group consisting of silicon dioxide and silicon nitride.

13. The process of claim 2, wherein the step of forming the spacer is performed such that the spacer includes a material that etches at a different etch rate compared to the first conductive member.

14. A process for forming an electrically programmable read-only memory cell comprising the steps of:
forming a floating gate adjacent to a semiconductor substrate having a first conductivity type;
forming a first conductive member lying adjacent to the floating gate and overlying a portion of the substrate that is not covered by the floating gate;
forming a spacer overlying and adjacent to the first conductive member and sides of the floating gate; and
forming a second conductive member overlying the first conductive member and spacer, wherein:
a portion of the spacer is surrounded by the first and second conductive members;
the first and second conductive members are electrically connected to each other; and
a combination of the first and second conductive members is a control gate for the memory cell.

15. The process of claim 14, further comprising steps of:
forming a first doped region having a second conductivity type that is opposite the first conductivity type, wherein the first doped region lies within the substrate and underlies a portion of the floating gate; and forming a second doped region having the second conductivity type, wherein:

this step is performed after the step of forming the spacer; and the second doped region lies within the substrate and underlies portions of the first conductive member and spacer but does not underlie the floating gate.

16. The process of claim 15, wherein:

the step of forming the first doped region is performed such that the first doped region is a drain region of the memory cell and is self-aligned to the floating gate; and the step of forming the second doped region is performed such that the second doped region is a source region of the memory cell and is self-aligned to the spacer.

17. The process of claim 15, wherein the step of forming the first conductive member is performed such that a portion of the first conductive member that overlies a channel region and does not overlie the floating gate is a select gate for the memory cell.

18. The process of claim 14, wherein the first and second conductive members include silicon.

19. The process of claim 14, wherein the step of forming the spacer is performed such that the spacer includes a material selected from a group consisting of silicon dioxide and silicon nitride.

20. The process of claim 14, wherein the step of forming the spacer is performed such that the spacer includes a material that etches at a different etch rate compared to the first conductive member.

* * * * *